United States Patent [19]
Akram

[11] Patent Number: 5,789,271
[45] Date of Patent: Aug. 4, 1998

[54] METHOD FOR FABRICATING MICROBUMP INTERCONNECT FOR BARE SEMICONDUCTOR DICE

[75] Inventor: Salman Akram, Boise, Id.

[73] Assignee: Micron Technology, Inc., Boise, Id.

[21] Appl. No.: 617,283

[22] Filed: Mar. 18, 1996

[51] Int. Cl.[6] .................................................. H01L 21/00
[52] U.S. Cl. ........................................................... 438/18
[58] Field of Search ............................ 438/18, 108, 612, 438/613; 257/737, 738, 779, 778; 324/765, 755

[56] References Cited

U.S. PATENT DOCUMENTS

| | | | |
|---|---|---|---|
| 3,461,357 | 8/1969 | Mutter et al. | 438/625 |
| 4,005,472 | 1/1977 | Harris et al. | 257/737 |
| 4,661,375 | 4/1987 | Thomas | 438/614 |
| 4,764,804 | 8/1988 | Sahara et al. | 257/737 |
| 5,072,289 | 12/1991 | Sugimoto et al. | 357/68 |
| 5,090,118 | 2/1992 | Kwon et al. | 29/843 |
| 5,123,850 | 6/1992 | Elder et al. | 439/67 |
| 5,225,037 | 7/1993 | Elder et al. | 156/644 |
| 5,262,718 | 11/1993 | Svendsen et al. | 324/158 P |
| 5,289,631 | 3/1994 | Koopman et al. | 29/840 |
| 5,302,891 | 4/1994 | Wood et al. | 324/158 F |
| 5,329,423 | 7/1994 | Scholz | 257/728 |
| 5,367,253 | 11/1994 | Wood et al. | 324/158.1 |
| 5,408,190 | 4/1995 | Wood et al. | 324/765 |
| 5,426,072 | 6/1995 | Finnila | 438/613 |
| 5,438,223 | 8/1995 | Higashi et al. | 257/774 |
| 5,440,240 | 8/1995 | Wood et al. | 324/765 |
| 5,487,999 | 1/1996 | Farnworth | 437/7 |
| 5,492,235 | 2/1996 | Crafts et al. | 438/614 |
| 5,534,465 | 7/1996 | Frye et al. | 438/108 |
| 5,602,422 | 2/1997 | Schuellet et al. | 257/737 |
| 5,661,336 | 8/1997 | Phelps, Jr. et al. | 257/668 |
| 5,678,301 | 10/1997 | Gochnour et al. | 29/827 |

FOREIGN PATENT DOCUMENTS 60-049652  3/1985  Japan.

OTHER PUBLICATIONS

Kuhn et al., "High density, Low–Temperature Solder Reflow Bonding of Silicon Chips to Plastic Substrates", IBM Tech. Disc. Bull., vol. 18, No. 10, p. 3477, Mar. 1976.

"Solder Bump Formation on Via Holes", IBM Tech. Disc. Bull., vol. 37, No. 06B, p. 299, Jun. 1994.

Yamamoto, Yashuhikio et al., "Evaluation of New Micro–Connection System Using Microbumps", Nitto Denko Corp., Technical Paper, ISHM '93 Proceedings, pp. 370–378, 1993.

Miyake, Koyoshi et al., "Connectivity Analysis of New 'Known Good Die' Connection System Using Microbumps", Technical Report, Nitto Denko Corp., pp. 1–7, 1994.

"Science Over Art, Our New IC Membrane Test Probe," Packard Hughes Interconnect Advertising Brochure, 1993.

*Primary Examiner*—John Niebling
*Assistant Examiner*—Thomas G. Bilodeau
*Attorney, Agent, or Firm*—Stephen A. Gratton

[57] ABSTRACT

A method for forming an interconnect for making a temporary or permanent electrical connection to a semiconductor dice is provided. The interconnect includes a rigid substrate on which an insulating layer and a pattern of conductors are formed. A compliant layer is formed on the insulating layer of a material such as polyimide. Vias are formed in the compliant layer with metal contacts in electrical communication with the conductors. Microbumps are formed on the compliant layer in electrical communication with the contacts and are adapted to flex with the compliant layer. The interconnect can be used to provide a temporary electrical connection for testing bare semiconductor dice. Alternately the interconnect can be used for flip chip mounting dice for fabricating multi chip modules and other electronic devices.

16 Claims, 4 Drawing Sheets

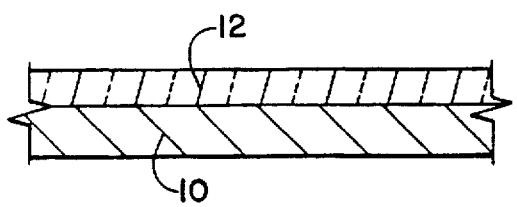
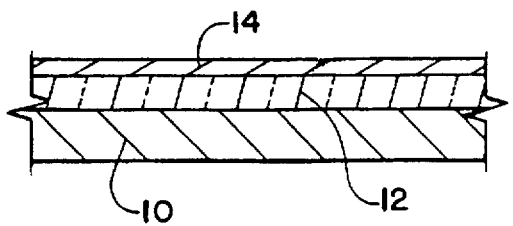
FIGURE IA
FIGURE IB
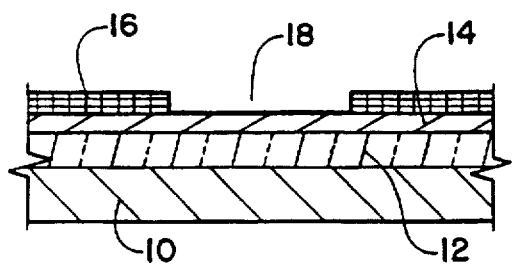
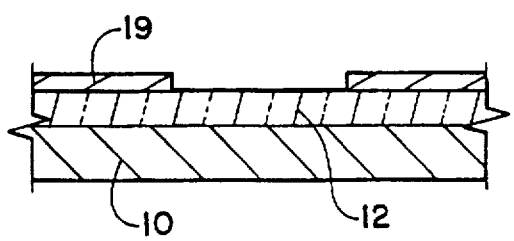
FIGURE IC
FIGURE ID
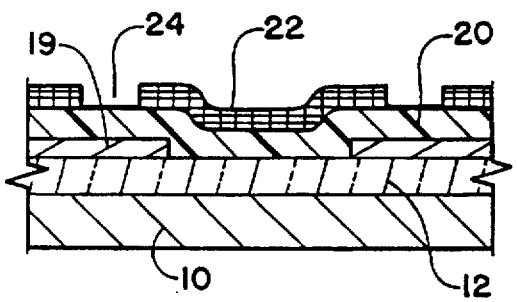
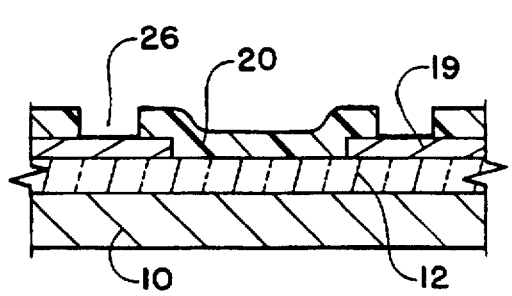
FIGURE IE
FIGURE IF
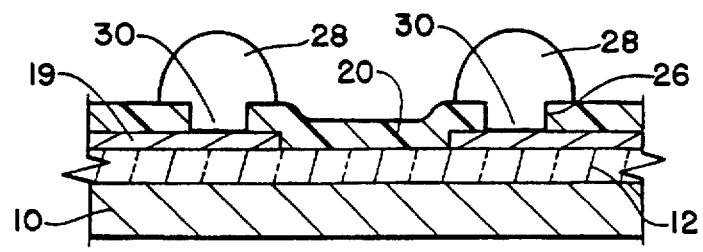
FIGURE IG

METHOD FOR FABRICATING MICROBUMP INTERCONNECT FOR BARE SEMICONDUCTOR DICE

FIELD OF THE INVENTION

This invention relates generally to semiconductor manufacture and specifically to a method for fabricating a microbump interconnect for a bare semiconductor die.

BACKGROUND OF THE INVENTION

In the manufacture of unpackaged semiconductor dice it is sometimes necessary to make an electrical connection with the bond pads of the dice for testing or other purposes. For example, burn-in and full functionality tests are used to certify each unpackaged die as a known good die (KGD). During the test procedures test apparatus for a single bare die (also referred to as carriers) take the place of conventional plastic or ceramic semiconductor packages. Exemplary test apparatus are disclosed in U.S. Pat. Nos. 5,302,891; 5,408,190 and 5,495,179 to Wood et al.

This type of test apparatus typically includes an interconnect component for making the temporary electrical connection between the die and test apparatus. For example, U.S. Pat. No. 5,483,741 to Akram et al. discloses a method for fabricating an interconnect with silicon contact members.

Another type of interconnect for these test apparatus is formed with microbump contact members. For example, U.S. Pat. No. 5,487,999 to Farnworth discloses an interconnect for bare dice that includes microbump contact members. Microbump interconnects can be fabricated using TAB tape developed for tape automated bonding of semiconductor dice. This type of TAB tape is sold by Nitto Denko America, Inc. under the trademark ASMATT.

The microbump contact members comprise metal bumps formed on an insulative polyimide film. The microbumps can be formed on metal filled vias using an electroplating process. In addition, conductive traces formed of patterned metal foil are also mounted to the polyimide film to establish a circuit path to the microbumps. For forming an interconnect for testing bare dice, the polyimide film with the microbumps and conductive traces thereon, can be mounted to a rigid substrate.

With this type of microbump interconnect, the manufacturing process for the microbumps is complicated and requires specialized manufacturing equipment. Following the microbump manufacturing process, the polyimide film must be cut to shape and mounted on the substrate. This can also be a complicated and tedious process. In particular, the polyimide film is fragile and difficult to cut and attach to the rigid substrate. In addition, an adhesive layer must be formed between the polyimide film and the rigid substrate. The thickness and compressive properties of this adhesive layer can have a profound effect on the function of the microbump interconnect. Accordingly, undesirable variables can be introduced by the steps and materials used during the substrate mounting process.

The present invention is directed to a simplified method for forming microbump interconnects directly on a rigid substrate. This eliminates a separate substrate mounting step for the microbumps. In addition, fabrication of the microbumps is simplified and an improved low resistance microbump structure is provided.

In view of the foregoing, it is an object of the present invention to provide an improved method for forming a microbump interconnect for bare semiconductor dice.

It is a further object of the invention to provide an improved method for forming a microbump interconnect having a rigid substrate and low resistance microbumps formed on a flexible compliant layer.

It is yet another object of the present invention to provide an improved microbump interconnect useful for making a temporary or permanent electrical connection to a bare semiconductor die.

It is a still further object of the present invention to provide an improved microbump interconnect that can be used in a test apparatus for testing bare dice or that can be used for flip chip mounting semiconductor dice to form multi chip modules and other electronic devices.

Other objects, advantages and capabilities of the present invention will become more apparent as the description proceeds.

SUMMARY OF THE INVENTION

In accordance with the present invention, an improved method for forming a microbump interconnect for bare semiconductor dice, and an improved microbump interconnect for bare dice are provided. Initially, a rigid substrate is formed of monocrystalline silicon, or other material having a coefficient of thermal expansion (CTE) matching that of a semiconductor die.

Following formation of the substrate, an electrically insulating layer (e.g., $SiO_2$) is formed on the substrate using a growth or deposition process. This step is followed by deposition of a conductive layer onto the insulating layer, and patterning of the conductive layer to form conductors. The conductive layer can be formed of a highly conductive metal, such as copper or aluminum, which is etched to form the pattern of conductors.

Following formation of the conductors, an electrically insulating compliant layer is blanket deposited on the conductors and substrate and etched with a pattern of vias. A preferred material for the compliant layer is polyimide, although other electrically insulating materials can also be used. Contacts are formed in the vias through the compliant layer and microbumps are formed on the contacts using an electrolytic or electroless plating process, or using a screen printing or evaporation process. Preferred materials for the microbumps include copper, nickel, gold, palladium and solder. Optionally a protective layer can be plated onto the microbumps.

The completed interconnect includes: a substrate having an electrically insulating layer formed thereon; a pattern of conductors formed on the insulating layer; an electrically insulating compliant layer formed over the conductors; vias and contacts formed through the compliant layer to the conductors; and microbumps formed in electrical communication with the contacts and conductors. Both the microbumps and the contacts for the interconnect, are low resistance electrical structures.

The interconnect can be used in a testing apparatus for testing a bare semiconductor die. Alternately, the interconnect can be used for flip chip mounting one or more bare dice in the fabrication of multi chip modules or other electronic devices.

BRIEF DESCRIPTION OF THE DRAWINGS

FIGS. 1A–1G are schematic cross sectional views of steps in a method for forming a microbump interconnect in accordance with the invention;

3

Figure 3:
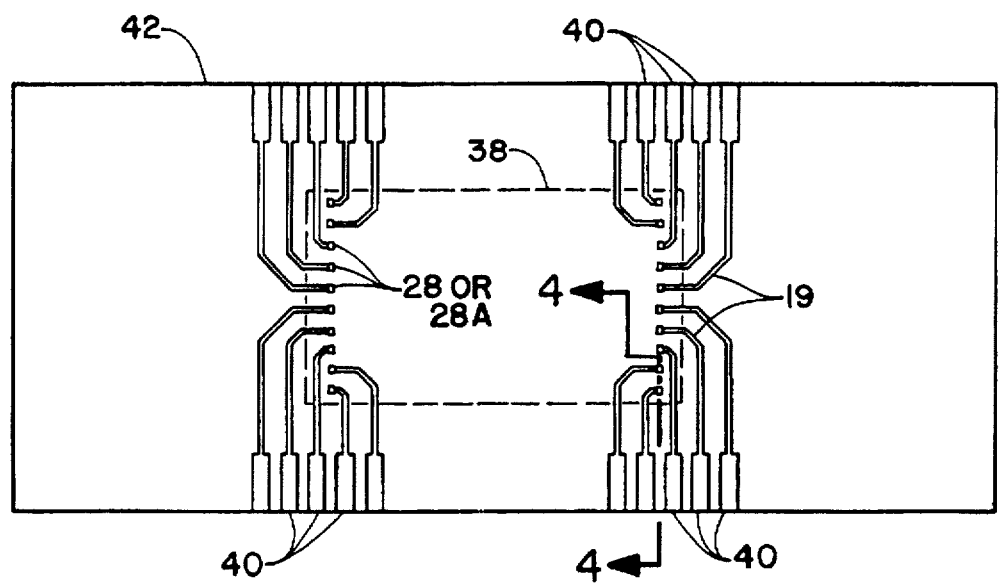
Figure 4:
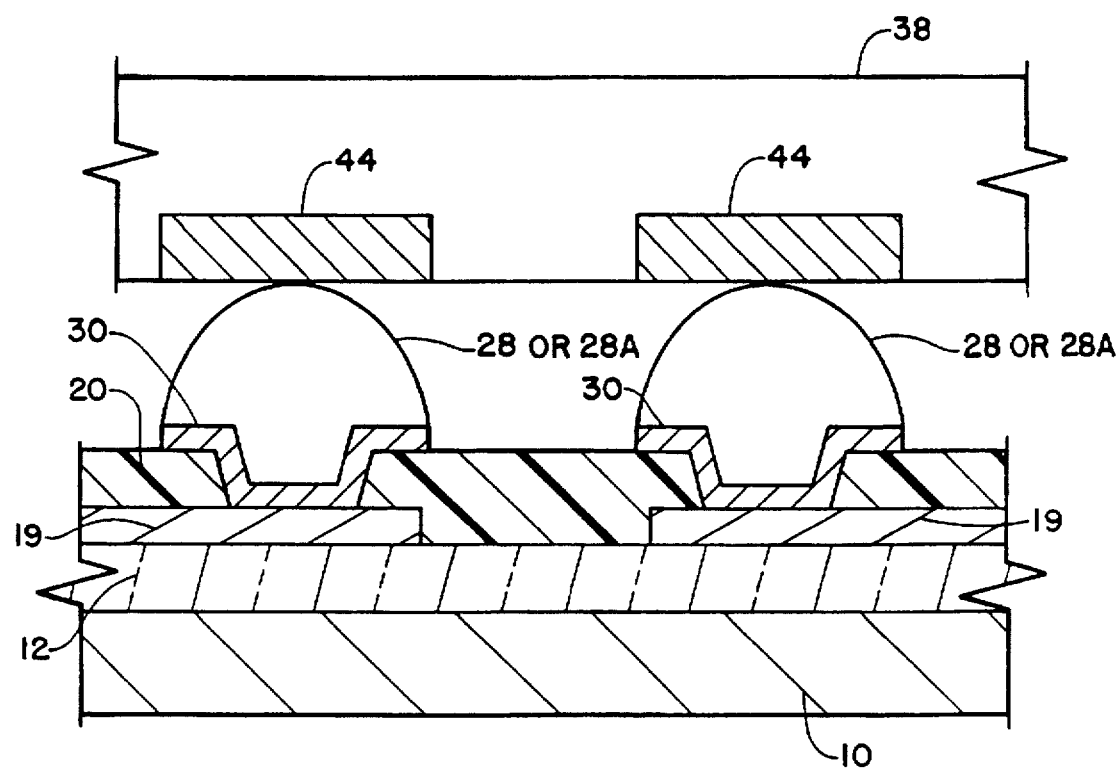
Figure 5:
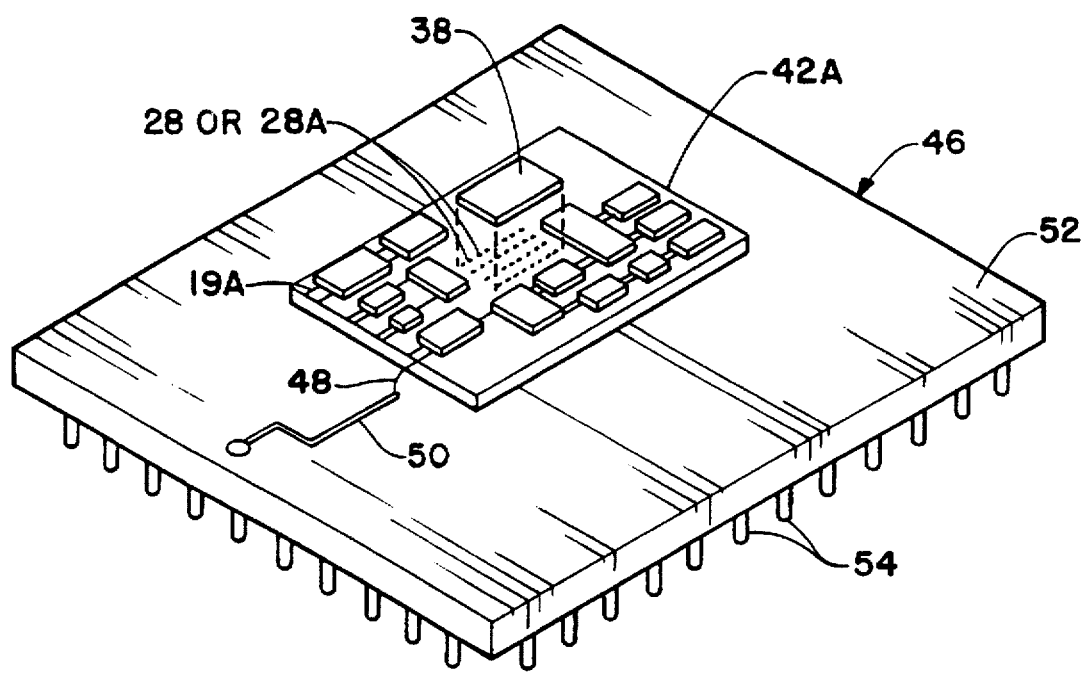

FIG. 3 is a plan view of a microbump interconnect formed in accordance with the invention with a semiconductor die superimposed thereon;

FIG. 4 is a cross sectional view taken along section line 4—4 of FIG. 3;

FIG. 5 is a perspective view of a multi chip module constructed using an interconnect formed in accordance with the invention.

DETAILED DESCRIPTION OF THE PREFERRED EMBODIMENT

Referring to FIGS. 1A–1G, steps in the method of the invention are illustrated. Initially as shown in FIG. 5A, a substrate 10 is formed or provided. The substrate 10 is formed of a material having a coefficient of thermal expansion (CTE) that closely matches the CTE of a silicon die. Suitable materials for the substrate include monocrystalline silicon, silicon-on-glass, silicon-on-sapphire, germanium, or ceramic.

As also shown in FIG. 1A, an insulating layer 12 is formed on the substrate 10. The insulating layer 12 is formed of an electrically insulating material such as an oxide, dielectric or insulating polymer. A representative thickness for the insulating layer 12 can be from about 1000 Å to 10 μm. The insulating layer 12 can be a grown or deposited oxide. For example, the insulating layer 12 can be formed as silicon dioxide ($SiO_2$) deposited using a CVD process. In this process, TEOS (tetraethylorthosilane) can be injected into a CVD reaction chamber to grow silicon dioxide ($SiO_2$) at a temperature of about 400° C. The insulating layer 12 can also be formed by exposing the substrate 10 to an oxidizing atmosphere in a reaction chamber. Furthermore, the insulating layer 12 can be formed of a dielectric material, such as $Si_3N_4$, deposited using CVD or other deposition process. Still further, the insulating layer 12 can be formed of polyimide, or similar electrically insulating polymeric material, spun on or otherwise deposited on the substrate 10.

Following formation of the insulating layer 12, and as shown in FIG. 1B, a conductive layer 14 is blanket deposited on the insulating layer 12. The conductive layer 14 is preferably formed of a highly conductive metal such as copper or aluminum or alloys thereof, or a refractory metal such as titanium, tungsten, tantalum or molybdenum or alloys of these metals. The conductive layer 14 can be blanket deposited by CVD or sputtering. A representative thickness for the conductive layer 14 can be from about 500 Å to 10 μm.

Following blanket deposition of the conductive layer 14 and as shown in FIG. 1C, a layer of photoresist 16 is deposited on the conductive layer 14 and developed. The layer of photoresist 16 can be deposited using a spin-on process and then soft baked to drive out solvents. A typical thickness for the layer of photoresist 16 can be about 10,000 Å to 30,000 Å. Following the softbake, the layer of photoresist 16 is aligned with a mask and exposed using collimated UV light. Next, the layer of photoresist 16 is developed to form a pattern of openings 18.

Referring to FIG. 1D, the layer of photoresist 16 patterned with the openings 18 (FIG. 1C) is then used to etch the conductive layer 14 to form a pattern of conductors 19. The pattern of the conductors 19 is clearly shown in FIG. 2. The conductors 19 are separated and electrically insulated from the substrate 10 by the insulating layer 12. Depending on the material used to form the conductive layer 14, a suitable wet etch process can be used to etch the conductors 19. As an example, for a conductive layer 14 formed of aluminum, a wet etchant such as $H_3PO_4$ can be used to etch the pattern of conductors 19.

Following the wet etch procedure, the layer of photoresist 16 can be stripped using a suitable wet etchant along with organic ashing. For a positive resist, a solvent such as acetone, methylethylketone or 1-methylethylketone can be used. For a negative resist, a solution that will not attack the underlying metal can be used.

Next, as shown in FIG. 1E, an electrically insulating compliant layer 20 is formed on the pattern of conductors 19 and on the exposed insulating layer 12 between the conductors 19. Although the complaint layer 20 is preferably formed of a compliant material, the compliant layer 20 can also be formed of a non-compliant but electrically insulating material.

The compliant layer 20 can be a dielectric material, such as an insulating polymer, deposited or otherwise formed on the substrate 10. For example, polyimide can be spun on, or cast in place, as a viscous material and then cured to form the compliant layer 20. Alternately, a separate piece of material, in tape form, can be attached to the substrate 10 to form the compliant layer 20. For example, polyimide tapes are commercially available from DuPont and are sold under the trademark Kapton™. In either case, a representative thickness for the compliant layer 20 can be from 0.5 μm to 15 μm.

As also shown in FIG. 1E, a layer of resist 22 is deposited and developed as previously described to form another resist mask with another pattern of openings 24. Next, as shown in FIG. 1F, the openings 24 in the layer of resist 22 are used to etch the compliant layer 20 to form vias 26 through the compliant layer 20 to desired locations on the conductors 19. The openings 24 in the resist 22 and thus the vias 26 in the compliant layer 20 are formed in a pattern that corresponds to the pattern of bond pads 44 (FIG. 4) on a semiconductor die 38 (FIG. 4). The vias 26 will be subsequently filled with a metal to form contacts 30 (FIG. 1G) in electrical communication with the conductors 19 The contacts 30 also provide a base for subsequently formed microbumps 28 (FIG. 1G).

Etching of the compliant layer 20 can be accomplished with a wet etchant. For a compliant layer 20 formed of polyimide, one suitable wet etchant is TMAH (tetramethylammonium hydroxide). Following formation of the vias 26, the layer of resist 22 is stripped as previously described.

Next, as shown in FIG. 1G, the vias 26 are filled with a contact material to form contacts 30 and the microbumps 28 are formed on the compliant layer 20 attached to the contacts 30. The microbumps 28 have an outside diameter greater than the inside diameter of the contacts 30. The contacts 30 and the microbumps 28 can be formed of the same metal using an electrolytic or electroless plating process. For example, the plated metal can be copper, nickel, gold or palladium. With electroless plating, an aqueous solution comprising metal ions and reducing agents is used. Nickel can be deposited using a solution containing Ni ions and a reducing agent such as hypophosphite or dimethylamine borane.

A representative diameter for the microbumps 28 can be from 15–100 μm. A spacing for the microbumps 28 will depend on the die bond pad spacing but will be on the order of 25–250 μm or greater. The microbumps 28 have a diameter that is substantially larger than the diameter of the vias 26. Accordingly, the microbumps 28 are supported in part by the compliant layer 20 and upon application of an external force can flex with the compliant layer 20.

Figure 2A:
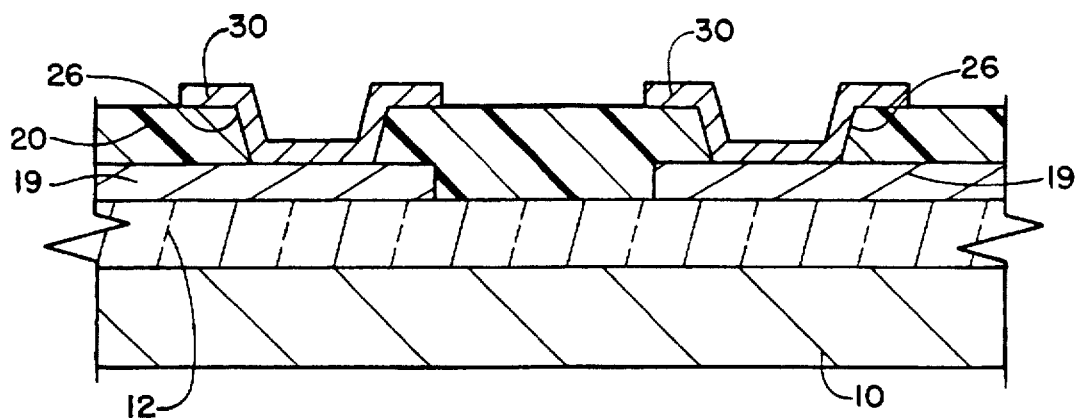
FIGS. 2A–2C are schematic cross sectional views of alternate steps for forming the microbump interconnect.
Figure 2B:
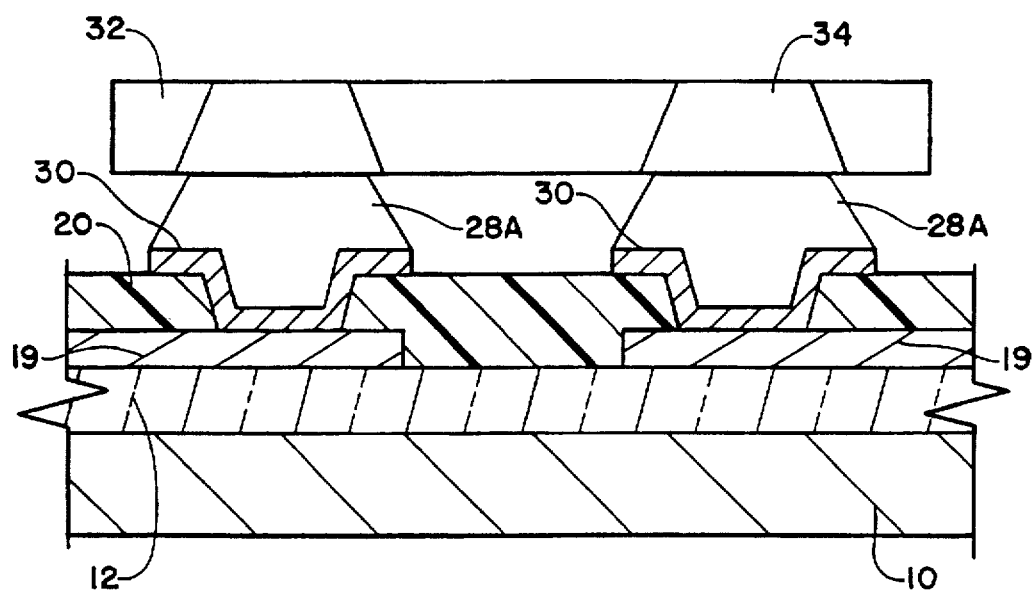
Figure 2C:
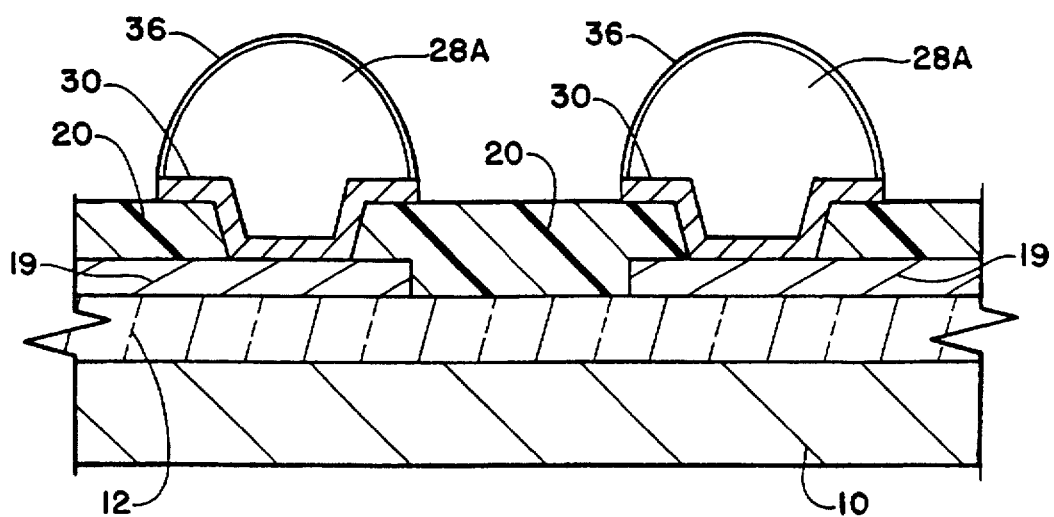

Referring to FIGS. 2A–2C, an alternate process for forming the microbumps 28 is shown. In this case, the microbumps 28A are formed of a solder material, such as a PbSn, deposited on contacts 30 formed of a solder wettable material. As shown in FIG. 2A, the substrate 10, conductors 19 and compliant layer 20 with vias 26, have been formed as previously described. For forming solder microbumps 28A, the contacts 30 are formed in the vias 26 in electrical contact with the conductors 19. The contacts 30 can be formed using an electrolytic or electroless plating process or a thin film deposition process such as evaporation. The contacts 30 are formed of a solder wettable metal such as copper, chromium or gold to which a subsequently deposited solder metal will adhere.

As shown in FIG. 2B, following formation of the contacts 30, the solder microbumps 28A are formed on the contacts 30 by screen printing or evaporation through openings 34 in a mask 32. With a printing process, the mask 32 is placed on the substrate 10 and the solder material is forced through the openings 34 in the mask 32 onto the contacts 30. With evaporation, the solder material is evaporated through the openings 34 in the mask 32. Evaporation through the openings 34 in the mask 32 can be similar to formation of a ball limiting metallurgy pad (BLM) for bumped dice.

A preferred solder material for the solder microbumps 28A is a PbSn solder (e.g., 67%Pb—33%Sn). Other alloys based on tin (Sn), silver (Ag), copper (Cu) and indium (In) metallurgy can also be used. An exemplary alloy would be 77.2% (Sn), 2.8% (Au) and 20% (In). The solder microbumps 28A initially will have a straight wall profile but can be thermally reflowed with a hemispherical or concave surface. For example, reflow in an $H_2$ ambient at a temperature of about 350° C. melts and homogenizes the microbumps 28A and forms a spherical or hemispherical shape. The reflowed shape of the microbumps 28A is shown in FIG. 2C. Optionally, a protective layer 36 can be formed on the reflowed microbumps 28A by plating an inert material such as gold.

FIG. 3 shows a plan view of the completed interconnect 42 and the superimposed outline of the semiconductor die 38. The interconnect 42 is adapted to make a temporary or permanent electrical connection to the die 38. The placement of the microbumps 28 (or 28A) matches the placement of the bond pads 44 (FIG. 3) on the die 38. In addition, the conductors 19 extend in a pattern to the outside edges of the interconnect 42 and can include enlarged bonding sites 40. The bonding sites 40 can be used to wire bond, or otherwise electrically connect, the interconnect 42 to a test apparatus such as disclosed in the previous cited patents to Wood et al. Alternately, as will be further explained, the interconnect 42 can be used to flip chip mount a plurality of dice 38 to form a multi chip module 46 (FIG. 5).

Referring to FIG. 4, an enlarged cross sectional view illustrating the electrical connection between the microbump 28 (or 28A) and the bond pad 44 on the die 38 is shown. For making a temporary electrical connection, such as would occur in a test apparatus (not shown), the microbump 28 (or 28A) merely contacts the bond pad 44. Preferably, the test fixture includes a mechanism for biasing the die 38 and interconnect 42 together. Mounted within the test fixture, the microbumps 28 (or 28A) can flex with the compliant layer 20. Dimensional variations between the bond pads 44 or microbumps 28 (or 28A), particularly in the z-direction, can be accommodated by this flexure.

Referring to FIG. 5, a multi chip module 46 constructed using an interconnect 42A formed substantially as previously described is shown. In this application, the electrical connection between the bond pads 44 (FIG. 4) on the dice 38 and the microbumps 28 (or 28A) on the interconnect 42A is permanent. The multi chip module 46 includes a ceramic base 52 having a plurality of external contacts 54. The interconnect 42A can be secured to the ceramic base 52 using an adhesive. In addition, bond wires 48 are wire bonded to the conductors 19A on the interconnect 42A and corresponding conductors 50 on the multi chip module 46.

In this embodiment, the interconnect 42A is configured to flip chip mount a plurality of dice 38. In addition, the conductors 19A on the interconnect 42A are configured to provide a desired circuit path between the dice 38. The conductors 19A are also configured to provide a desired circuit path to the conductors 50 on the ceramic base 52 of the multi chip module 46. The dice 38 can be flip chip mounted to the microbumps 28 (or 28A) using flip chip optical alignment techniques and apparatus. U.S. Pat. No. 5,634,267 incorporated herein by reference, describes an optical alignment technique for aligning the bond pads 44 on the dice 38 to the microbumps 28 (or 28A) on the interconnect 42A.

Following alignment of the dice 38 and interconnect 42A, the dice 38 are permanently bonded to the microbumps 28A. A preferred method of bonding is with a reflow thermal cycle. This can be accomplished one die 38 at a time using a localized heat source, or on all of the dice 38 at once using an oven. The reflow bonding process is preferably performed with the interconnect 42A having solder microbumps 28A as previously described. During the reflow thermal cycle, the solder microbumps 28A melt and permanently bond to the bond pads 44 on the dice 38. Following the bonding process flux residues can be cleaned with solvents that are known in the art. This is followed by electrical testing of the multi chip module 46.

Thus the invention provides an improved method for forming a microbump interconnect and an improved microbump interconnect structure. The method is characterized by its simplicity and adaptability to volume manufacture using semiconductor circuit fabrication techniques. In addition, the resultant interconnect is characterized by low resistance microbumps and low resistance contacts between the microbumps and a pattern of conductors. Furthermore, the microbump interconnect has a unitary structure but with a built in compliant layer to provide flexure for the microbumps.

Although preferred materials have been described, it is to be understood that other materials may also be utilized. Furthermore, although the method of the invention has been described with reference to certain preferred embodiments, as will be apparent to those skilled in the art, certain changes and modifications can be made without departing from the scope of the invention as defined by the following claims.

What is claimed is:

1. A method for fabricating an interconnect for testing semiconductor dice comprising:

providing a substrate comprising silicon;

forming a first layer on the substrate, the first layer comprising an electrically insulating material;

forming a plurality of conductors on the first layer;

forming a second layer on the conductors and on the first layer, the second layer comprising a polymeric material;

forming a plurality of vias through the second layer to the conductors, the vias having a pattern matching pads on a semiconductor die; and forming metal microbumps in the vias in electrical communication with the conductors, the microbumps configured to electrically engage the pads on the die and to flex with the second layer to accommodate dimensional variations in the Dads or in the microbumps.

2. The method of claim 1 further comprising placing the interconnect in a test apparatus configured to contain the die for testing, such that the second layer and the microbumps can flex in a Z-direction upon contact with the pads.

3. The method of claim 1 further comprising forming a protective layer on the microbump, the protective layer comprising an inert material.

4. The method of claim 1 wherein forming the metal microbumps comprises a process selected from the group consisting of electroless plating, and screen printing.

5. A method for fabricating an interconnect for testing semiconductor dice comprising:

providing a substrate comprising silicon;

forming an electrically insulating first layer on the substrate;

forming a plurality of conductors on the first layer;

forming a second layer on the conductors and on the first layer, the second layer comprising a polymeric material;

forming a plurality of vias through the second layer to the conductors, the vias having a pattern matching that of pads on a semiconductor die;

electrolessly depositing metal microbumps in the vias in electrical communication with the conductors, the microbumps configured to electrically engage the pads on the die and to flex with the second layer to accommodate dimensional variations in the pads or the microbumps.

6. The method of claim 5 further comprising placing the interconnect in a test apparatus configured to contain the die for testing, such that the second layer and the microbumps can flex in a Z-direction upon contact with the pads.

7. The method of claim 5 further comprising forming a protective layer on each microbump, the protective layer comprising an inert metal.

8. A method for fabricating an interconnect for testing semiconductor dice comprising:

providing a substrate comprising silicon;

forming an electrically insulating first layer on the substrate;

forming a plurality of conductors on the first layer;

forming a second layer on the conductors and on the first layer, the second layer comprising a polymeric material;

forming a plurality of vias through the compliant layer to the conductors in a pattern matching that of pads on a semiconductor die;

screen printing metal microbumps in the vias in electrical communication with the conductors, the microbumps configured to electrically engage the pads on the die and to flex with the second layer to accommodate dimensional variations in the pads or the microbumps.

9. The method of claim 8 further comprising placing the interconnect in a test apparatus configured to contain the die for testing, such that the second layer and the microbumps can flex in a Z-direction upon contact with the pads.

10. The method of claim 8 further comprising forming an inert metal protective layer on each microbump.

11. The method of claim 8 further comprising placing the interconnect in a test apparatus configured to contain the die for testing, and testing the die by transmitting test signals through the microbumps to the pads.

12. A method for fabricating an interconnect for testing semiconductor dice comprising:

providing a substrate comprising silicon, the substrate configured for placement in a test apparatus adapted to contain a semiconductor die for testing;

forming an electrically insulating first layer on the substrate;

forming a plurality of conductors on the first layer;

forming a second layer on the conductors and on the first layer, the second layer comprising a polymeric material;

forming a first pattern of vias through the second layer to the conductors, the first pattern matching a second pattern of pads on the die;

forming a plurality of metal microbumps in the vias; and placing the interconnect in the test apparatus such that the second layer and the microbumps can flex upon contact with the pads in a Z-direction to accommodate dimensional variations in the pads or in the microbumps.

13. The method of claim 12 wherein forming the microbumps comprises a process selected from the group consisting of electroless deposition and stencil printing.

14. The method of claim 12 wherein the second layer comprises polyimide tape attached to the substrate.

15. The method of claim 12 wherein the microbumps comprise a material selected from the group consisting of copper, gold, nickel, palladium and solder.

16. The method as claimed in claim 12 and further comprising forming the contacts of a solder wettable material and forming the microbumps of solder.

* * * * *

UNITED STATES PATENT AND TRADEMARK OFFICE
CERTIFICATE OF CORRECTION

PATENT NO. : 5,789,271
DATED : Aug. 4, 1998
INVENTOR(S) : Salman Akram

It is certified that error appears in the above-identified patent and that said Letters Patent is hereby corrected as shown below:

In column 7, line 5
  delete "Dads" and insert --pads--

Signed and Sealed this

Thirteenth Day of October 1998

Attest:

BRUCE LEHMAN

Attesting Officer

Commissioner of Patents and Trademarks